United States Patent
Rickes et al.

(10) Patent No.: US 6,807,080 B2
(45) Date of Patent: Oct. 19, 2004

(54) ENHANCED STORAGE STATES IN AN MEMORY

(75) Inventors: Jurgen Thomas Rickes, Cupertino, CA (US); Hugh Pryor McAdams, McKinney, TX (US); Scott Robert Summerfelt, Garland, TX (US)

(73) Assignees: Agilent Technologies, Inc., Palo Alto, CA (US); Texas Instrument, Inc., Dallas, CA (US)

( * ) Notice: Subject to any disclaimer, the term of this patent is extended or adjusted under 35 U.S.C. 154(b) by 54 days.

(21) Appl. No.: 10/150,744

(22) Filed: May 17, 2002

(65) Prior Publication Data

US 2003/0214830 A1 Nov. 20, 2003

(51) Int. Cl.⁷ .............................................. G11C 11/22
(52) U.S. Cl. ...................................... 365/145; 365/227
(58) Field of Search ................................ 365/145, 226, 365/227, 104, 149, 198.04, 65

(56) References Cited

U.S. PATENT DOCUMENTS

| | | | | |
|---|---|---|---|---|
| 5,455,786 A | * | 10/1995 | Takeuchi et al. | 365/145 |
| 5,798,964 A | * | 8/1998 | Shimizu et al. | 365/145 |
| 6,201,731 B1 | * | 3/2001 | Kamp et al. | 365/185.02 |
| 6,236,607 B1 | * | 5/2001 | Schlager et al. | 365/210 |
| 6,541,375 B1 | * | 4/2003 | Hayashi et al. | 438/679 |

* cited by examiner

*Primary Examiner*—Thong Q. Le

(57) ABSTRACT

A memory with mechanisms for enhancing storage states without boosting voltages to levels that damage storage cell structures. A storage cell according to the present teachings includes a storage structure capable of switching storage states. A memory according to the present teachings includes means for writing the storage cell by applying a first voltage to a first node of the storage structure and for applying a second voltage to a second node of the storage structure such that the first and second voltages have opposite polarities.

20 Claims, 2 Drawing Sheets

ENHANCED STORAGE STATES IN AN MEMORY

BACKGROUND OF THE INVENTION

1. Field of Invention

The present invention pertains to the field of random access memories. More particularly, this invention relates to storage states in a memory cell.

2. Art Background

A typical random access memory includes an array of storage cells. Each storage cell typically includes a storage structure which is capable of changing storage states. For example, a storage cell in a ferroelectric random access memory (FeRAM) typically includes a ferroelectric capacitor capable of changing stored charge polarities.

The storage state of a storage cell typically indicates its logic state. A storage cell is usually written by applying programming voltages which alter its storage state. For example, an FeRAM storage cell is usually written applying programming voltages that alter the charge polarities of its ferroelectric capacitor.

It is usually desirable to provide a storage cell that enhances the likelihood that its storage state will be discernable during a read operation. Unfortunately, structures in a storage cell that are used for storage cell access may reduce the discernability of its storage states. In an FeRAM storage cell, for example, a programming voltage is usually applied to the ferroelectric capacitor through an access transistor. Unfortunately, the access transistor usually degrades the amount of programming voltage that reaches the ferroelectric capacitor, thereby limiting the amount of electrical charge that it accumulates.

One prior method for avoiding such voltage degradation during programming is to apply boosted voltage levels during programming. In programming a typical prior FeRAM cell, for example, a supply-level voltage ($V_{DD}$) is usually applied the access transistor of the storage cell and a boosted supply-level voltage ($V_{PP}$) is usually applied to a control gate of the access transistor. Typically, $V_{PP}$ is greater than $V_{DD}$ by a threshold voltage ($V_{TH,be}$) to enable a maximum amount of charge to pass through the access transistor and to the ferroelectric capacitor. Unfortunately, high levels of $V_{PP}$ may damage the gate structure of the access transistor, thereby reducing the reliability and service life of the memory. Similar problems may be encountered in other types of memories.

SUMMARY OF THE INVENTION

A memory is disclosed with mechanisms for enhancing storage states without boosting voltages to levels that damage storage cell structures. A storage cell according to the present teachings includes a storage structure capable of switching storage states. A memory according to the present teachings includes means for writing the storage cell by applying a first voltage to a first node of the storage structure and for applying a second voltage to a second node of the storage structure such that the first and second voltages have opposite polarities. The magnitude of the second voltage is selected to enhance the overall voltage applied to the storage structure during programming.

Other features and advantages of the present invention will be apparent from the detailed description that follows.

BRIEF DESCRIPTION OF THE DRAWINGS

The present invention is described with respect to particular exemplary embodiments thereof and reference is accordingly made to the drawings in which.

DETAILED DESCRIPTION

Figure 1:
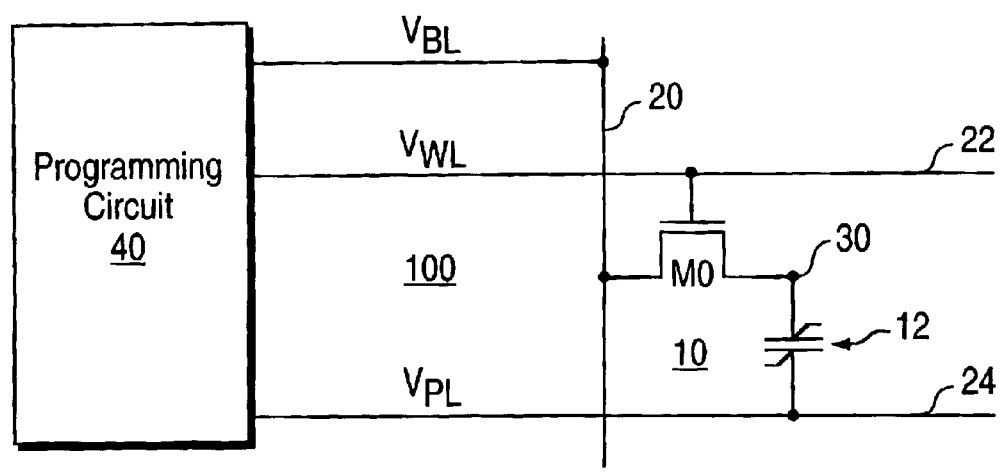
FIG. 1 shows one embodiment of a memory according to the present teachings.

FIG. 1 shows one embodiment of a memory 100 according to the present teachings. The memory 100 shown is a ferroelectric random access memory (FeRAM). The present teachings are nevertheless applicable to other types of memories that employ other types of storage structures. Examples include DRAM structures.

The memory 100 includes an array of storage cells such as a storage cell 10 shown. The storage cell 10 includes a ferroelectric capacitor 12 as its storage structure and an access transistor M0. The remaining storage cells (not shown) in the memory 100 may have a similar arrangement.

The memory 100 also includes a programming circuit 40. The programming circuit 40 programs the storage cell 10 to a logic state by applying a voltage $V_{BL}$ to a bit line 20 coupled to the storage cell 10 and applying a voltage $V_{WL}$ to a word line 22 coupled to the storage cell 10 and applying a voltage $V_{PL}$ to a plate line 24 coupled to the storage cell 10.

When charging a ferroelectric capacitor, the programming circuit 40 generates the voltages $V_{BL}$, $V_{WL}$, and $V_{PL}$ so that voltages of opposite polarities are applied to opposite ends of the ferroelectric capacitor 12. In one embodiment, the programming circuit 40 applies a positive voltage to a storage node 30 and a small negative voltage to the plate line 24 during programming. These voltages are selected to enhance the amount of voltage $V_{FE}$ applied across the ferroelectric capacitor 12 during programming.

The magnitude of the small negative voltage applied to the plate line 24 may be preselected to compensate for an amount of voltage loss caused by the access transistor M0. The voltage loss caused by the access transistor M0 may be increased by the Body effect and may be determined by measurement or other methods.

Figure 2:
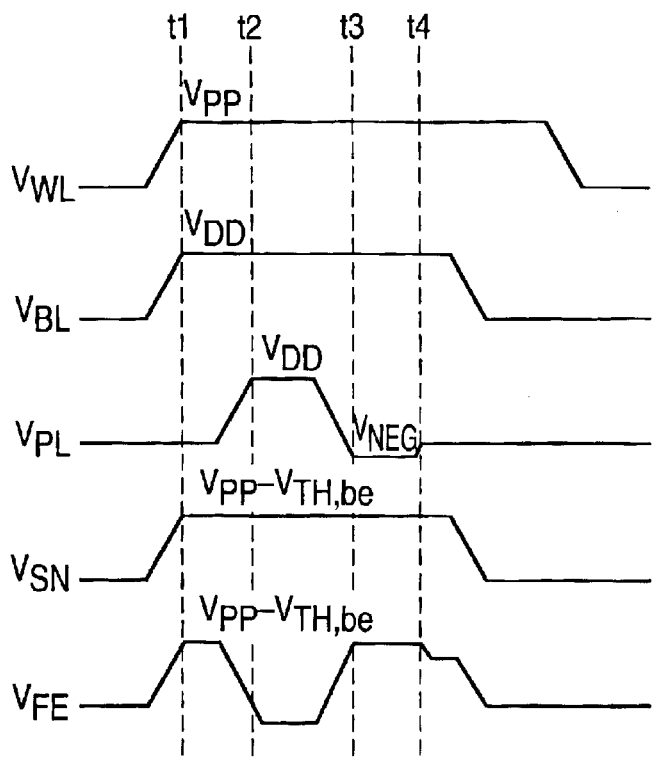
FIG. 2 shows a programming operation on the storage cell in one embodiment.

FIG. 2 shows a programming operation on the storage cell 10 in one embodiment. During a programming operation, i.e. a write operation, the programming circuit 40 generates the voltages $V_{WL}$ and $V_{BL}$ and $V_{PL}$ as shown. Also shown are the voltage $V_{SN}$ at the storage node 30 and the resulting overall voltage $V_{FE}$ applied across the ferroelectric capacitor 12.

Prior to time t1, the programming circuit 40 maintains the voltages $V_{WL}$ and $V_{BL}$ and $V_{PL}$ at a substantially zero level. At time t1, the programming circuit 40 raises $V_{WL}$ to $V_{PP}$ and raises $V_{BL}$ to $V_{DD}$. In one embodiment, $V_{PP}$ is approximately 2.0 volts and $V_{DD}$ is approximately 1.5 volts.

After time t1, $V_{SN}$ and $V_{FE}$ both rise to $V_{PP}-V_{TH,be}$. In one embodiment, $V_{TH,be}$ is approximately 0.65 volts. Thus, after time t1, $V_{SN}$ and $V_{FE}$ both rise to 2.0−0.65=1.35 volts approximately.

At time t2, the programming circuit 40 raises $V_{PL}$ to $V_{DD}$—in one embodiment approximately 1.5 volts. This lowers $V_{FE}$ to approximately −0.15 volts after time t2. The programming circuit 40 raises $V_{PL}$ to $V_{DD}$ at time t2 for programming operations to other storage cells coupled to the plate line 24.

At time t3, the programming circuit 40 drives $V_{PL}$ to a small negative voltage $V_{NEG}$. In one embodiment, the small negative voltage $V_{NEG}$ is preselected to be approximately −0.15 volts in accordance with the effects of the $V_{TH,be}$ characteristic of the access transistor M0. As a consequence of the negative voltage applied to the plate line 24 at time t3, the overall voltage $V_{FE}$ across the ferroelectric capacitor 12 is, in one embodiment, 1.35+0.15=1.5 volts.

Thus, $V_{FE}$ after time t3 is equivalent to full $V_{DD}$ charging of the ferroelectric capacitor 12 but with only 2.0 volts applied to the gate of the access transistor M0. The relatively low level of 2.0 volts at the gate of the access transistor M0 causes relatively low stress on its gate oxide layer during programming in comparison to a higher voltage level that would otherwise be needed at the gate to yield a $V_{FE}$ up to $V_{DD}$—i.e. in the absence of the negative voltage applied to the plate line 24.

At time t4, the programming circuit 40 returns $V_{PL}$ to a substantially zero voltage level which causes $V_{FE}$ to drop to 1.35 volts. Thereafter, the programming circuit 40 returns $V_{WL}$ and $V_{BL}$ and $V_{PL}$ to substantially zero levels.

Figure 3:
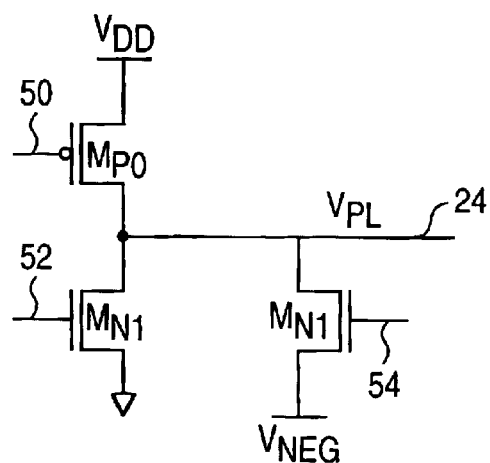
FIG. 3 shows a plate line driver in a programming circuit in one embodiment.

FIG. 3 shows a plate line driver in the programming circuit 40 in one embodiment. The plate line driver provides three voltage levels—$V_{DD}$, zero, and $V_{NEG}$—for driving the plate line 24. The particular voltage applied to the plate line 24 is determined by states of a set of control lines 50–54. The control lines 50–54 may be driven by a programming control circuit (not shown) to accomplish the timing shown above. The transistor $M_{P0}$ is a p-channel device and the transistors $M_{N0}$ and $M_{N1}$ are n-channel devices. The transistors $M_{P0}$ and $M_{N1}$ function as a CMOS inverter that provide the $V_{DD}$ and zero voltage levels to the plate line 24 and the transistor $M_{N1}$ provides the $V_{NEG}$ level to the plate line 24.

The foregoing detailed description of the present invention is provided for the purposes of illustration and is not intended to be exhaustive or to limit the invention to the precise embodiment disclosed. Accordingly, the scope of the present invention is defined by the appended claims.

What is claimed is:

1. A memory, comprising:
    storage cell having a storage structure capable of switching storage states;
    programming circuit that writes the storage cell by applying a first voltage to a first node of the storage structure and applying a second voltage to a second node of the storage structure such that the first and second voltages have opposite polarities.

2. The memory of claim 1, wherein the first voltage is a positive voltage and the second voltage is a negative voltage.

3. The memory of claim 1, wherein the second voltage is preselected such that an overall voltage drop across the storage structure is substantially equal to a supply voltage in the memory.

4. The memory of claim 1, wherein the storage cell includes an access transistor coupled to the first node of the storage structure.

5. The memory of claim 4, wherein the programming circuit comprises:
    means for switching on the access transistor such that the access transistor passes the first voltage to the first node;
    means for applying the second voltage to the second node such that the second voltage compensates for a threshold voltage loss in the access transistor.

6. The memory of claim 1, wherein the storage structure is a ferroelectric capacitor coupled between a storage node of the storage cell and a plate line to the storage cell.

7. The memory of claim 6, wherein the programming circuit comprises:
    means for applying the first voltage to the storage node such that the first voltage is a positive voltage;
    means for applying the second voltage to the plate line such that second voltage is a negative voltage.

8. The memory of claim 7, wherein a magnitude of the second voltage is preselected such that an overall voltage drop across the ferroelectric capacitor is substantially equal to a supply voltage in the memory.

9. The memory of claim 8, wherein the means for applying the first voltage includes an access transistor such that the magnitude is preselected in response to a voltage loss in the access transistor.

10. A method for writing a storage cell in a memory, comprising the steps of:
    applying a first voltage to a first node of a storage structure in the storage cell;
    applying a second voltage to a second node of the storage structure such that the first and second voltages have opposite polarities.

11. The method of claim 10, wherein the first voltage is a positive voltage and the second voltage is a negative voltage.

12. The method of claim 10, further comprising the step of selecting the second voltage such that an overall voltage drop across the storage structure is substantially equal to a supply voltage in the memory.

13. The method of claim 10, wherein the steps of applying the first and second voltages comprise the steps of:
    switching on the access transistor such that the access transistor passes the first voltage to the first node;
    applying the second voltage to the second node such that the second voltage compensates for a threshold voltage loss in the access transistor.

14. The method of claim 10, wherein the storage structure is a ferroelectric capacitor coupled between a storage node of the storage cell and a plate line to the storage cell.

15. The method of claim 14, wherein the steps of applying the first and second voltages comprise the steps of:
    applying the first voltage to the storage node such that the first voltage is a positive voltage;
    applying the second voltage to the plate line such that second voltage is a negative voltage.

16. The method of claim 15, further comprising the step of selecting a magnitude of the second voltage such that an overall voltage drop across the ferroelectric capacitor is substantially equal to a supply voltage in the memory.

17. The method of claim 16, wherein the step of selecting comprises the step of selecting the magnitude in response to a voltage loss in an access transistor of the storage cell.

18. A memory, comprising:
    storage structure having a storage node coupled to an access transistor and a node coupled to a plate line;
    programming circuit that writes the storage structure by applying a positive voltage to the access transistor and by applying a negative voltage to the plate line such that a magnitude of the negative voltage is selected to compensate for an amount of loss of the positive voltage caused by the access transistor.

19. The memory of claim 18, wherein the negative voltage compensates for a threshold voltage loss in the access transistor.

20. The memory of claim 18, wherein the magnitude of the negative voltage is selected such that an overall voltage drop across the storage structure is substantially equal to a supply voltage in the memory.

* * * * *